United States Patent
Weil et al.

[11] Patent Number: 6,029,578
[45] Date of Patent: Feb. 29, 2000

[54] METHOD AND DEVICE FOR STARTING A MACHINE

[75] Inventors: Stefan Weil, Ladenburg; Michael Pritschow, Wiesloch; Manfred Gaeng, Oberhausen/Rheinhausen, all of Germany

[73] Assignee: Heidelberger Druckmaschinen AG, Heidelberg, Germany

[21] Appl. No.: 09/175,499

[22] Filed: Oct. 20, 1998

[30] Foreign Application Priority Data

Oct. 21, 1997 [DE] Germany .................... 197 46 323

[51] Int. Cl.⁷ ..................................... B41L 7/00
[52] U.S. Cl. ............... 101/494; 307/116; 318/445; 361/179
[58] Field of Search .................. 101/494; 307/116, 307/119, 141; 361/179, 181; 318/445

[56] References Cited

U.S. PATENT DOCUMENTS

| | | | |
|---|---|---|---|
| 4,412,268 | 10/1983 | Dassow | 361/181 |
| 4,482,845 | 11/1984 | Roylance et al. | 315/360 |
| 4,580,025 | 4/1986 | Carlson et al. | 219/708 |
| 4,977,831 | 12/1990 | Walter | 101/365 |
| 5,341,036 | 8/1994 | Wheeler et al. | 307/328 |
| 5,461,560 | 10/1995 | Uribe | 364/188 |

FOREIGN PATENT DOCUMENTS

| | | |
|---|---|---|
| 1287389 | 8/1991 | Canada . |
| 0 095 664 | 12/1989 | European Pat. Off. . |
| 0 649 744 A1 | 4/1995 | European Pat. Off. . |
| 38 26 383 | 2/1990 | Germany . |

OTHER PUBLICATIONS

"Intellegent Keys", Elektro–anzeiger 46, No. 3, Mar., 1993, p. 32. English abstracts provided.

"MeasuresPressure and Position", FSR Technology. English abstracts provided.

"Finger To Window", Elektrotechnik fur die Automatisierung 11, Nov. 20, 1995, p. 36. English abstracts provided.

*Primary Examiner*—Edgar Burr
*Assistant Examiner*—Minh H. Chau
*Attorney, Agent, or Firm*—Kenyon & Kenyon

[57] ABSTRACT

A method and a device for starting a machine, in particular, a printing press, using a sensor or sensor field which emits a start signal during the approach of a part of the body of a machine operator. According to the method, the machine is automatically started if the start signal appears twice consecutively and if the following additional conditions, automatically checked by a machine controller, are met: No start signal is present within a first predefined time period following the instant of the first appearance of the start signal in a predefined time interval, and the start signal reappears within a second predefined time period following the first predefined time period. The device includes a proximity- or touch-sensitive operating surface, which has a first partial surface having the function of a machine starter and second partial surface, which blocks the function of the first partial surface for a predefined period of time in response to proximity or contact.

18 Claims, 4 Drawing Sheets

METHOD AND DEVICE FOR STARTING A MACHINE

FIELD OF THE INVENTION

The present invention concerns a method and a device for starting a machine.

RELATED TECHNOLOGY

Machines with hazard potential such as printing presses have previously been started by manually actuating an electromechanical button. Such a button requires a certain minimum actuating force and preferably has a well-defined pressure point. This allows unintentional starting of the machine to be reliably prevented, in particular when additional safety devices such as acoustic start warnings and emergency shutoff buttons are provided. Furthermore, European Patent No. 0 095 664 B2 describes a control device for a printing press, where the command button must be depressed twice for the command to be executed in order to reduce the possibility of error.

In order to simplify operation, it would be desirable if the machine could also be started with operator's controls other than electromechanical switches or buttons. Such operator's controls include, for example, touch screens, touch pads, and membrane keypads such as those used with data terminals or personal computers. A terminal or personal computer with such operator's controls can be used to control and/or monitor a plurality of functions of a printing press, but, for safety reasons, does not traditionally allow a printing press to be started, since the operator's controls are easily triggered accidentally, for example by accidentally touching them with the finger or by wiping motions such as those that occur when cleaning a touch screen.

SUMMARY OF THE INVENTION

An object of the present invention is to provide touch- or proximity-sensitive operator's controls with reliable protection against erroneous triggering so that these can be used for starting machines with hazard potential.

The present invention provides a method for starting a machine using a sensor or sensor field emitting a start signal upon the approach of a part of the body of a machine operator, characterized in that the machine is automatically started if the start signal appears twice consecutively and if, in addition, the following two conditions, automatically verified by a machine controller, are met:

no start signal is present within a first predefined time period following the instant of the first appearance of the start signal in a predefined time interval, and the start signal reappears within a second predefined time period following the first predefined time period.

The present invention also provides a device for starting a machine, characterized in that the device contains a proximity- or touch-sensitive operating surface, which has a first partial surface (6; 8) having the function of starting the machine, and which has at least one second partial surface (7; 9), which, in response to proximity or contact, blocks the function of the first partial surface for a predefined time period.

The method and device according to the present invention are based on a common principle of defining blocking areas that may be of temporal or spatial nature. In the method using time windows for blocking, there is a predefined time range in which certain predefined actions must take place for the machine start to be enabled. In the method involving blocking partial areas on the operating surface there is a spatial range where the operator's action must take place. Both methods reduce the probability of unwanted erroneous triggering to a great degree. Even greater safety is achieved through the combination of a time range with a spatial range; here the operator's action must take place within both ranges.

In a preferred embodiment, the sensor or sensor field or operating surface are touch-sensitive; proximity switches can also be used, which respond when a part of the body of the operator approaches them. The present invention is particularly well-suited for touch-screens and touch pads as operating surfaces, but also for keypads, in particular membrane keypads.

The present method represents an advantageous compromise between safety and operating convenience, in particular for printing presses, in that the time conditions are selected so that the predefined time interval between the instant of the first appearance of the start signal and the first predefined time period is 1 second, and the first predefined time period is 2 seconds. In addition, the second predefined time period should be at least 3 and at most 6 seconds and follow the first predefined time period immediately; it may also follow the first predefined period within any predefined time interval.

The device according to the present invention provides a high degree of safety against erroneous triggering if the second partial surface(s) has (have) a much greater surface area than the first partial surface and/or if the second partial surface(s) is (are) arranged in the proximity of the first partial surface. In a preferred embodiment for touch screens or touch pads, the second partial surface forms a contiguous area around the first partial surface.

The present invention is not limited to essentially flat operating surfaces such as touch-screens or touch pads. Rather, the term operating surface refers to any arrangement of sensors along a surface that may be spatially curved or angular.

The present invention is particularly well suited for starting printing presses, but also for other machines such as binding machines, cutting machines, and other machines in a printing shop environment.

Further advantageous embodiments of the method of the present invention include: (a) that the sensor or sensor field is touch-sensitive, and the approach of a part of the body of the machine operator to the sensor or sensor field involves contact with the same; (b) that the predefined time interval between the instant of the first appearance of the start signal and the first predefined time period is 1 second and the first predefined time period is 2 seconds; (c) that the second predefined time period immediately follows the first predefined period and is between 3 and 6 seconds long; (d) that the machine is started using a touch-sensitive screen (2), which displays an image or a partial image (5), which forms the sensor field for starting the machine; (e) that the touch-sensitive screen is a component of a data terminal or a personal computer connected to the machine controller via a data cable; and (f) that the machine is a printing press.

Further advantageous embodiments of the device of the present invention include: (a) that the second partial surface (s) (7; 9) has (have) a substantially larger surface area than the first partial surface (6; 8); (b) that the second partial surface(s) (7; 9) is (are) arranged in the proximity of the first partial surface (6; 8); (c) that the second partial surface(s) (7; 9) is (are) arranged all around the first partial surface (6; 8); (d) that a second partial surface (7) is provided, which forms a contiguous surface all around the first partial surface (6);

(e) that the operating surface is essentially planar; (f) that the operating surface is a touch-sensitive screen, which displays partial images forming the first and second partial surfaces; (g) that the operating surface is a touch-sensitive sensor field; (h) that the operating surface is a keyboard with one key (8) forming the first partial surface and with a plurality of additional keys (9) forming the second partial surface(s); (i) that the predefined time period during which the function of the first partial surface is blocked in response to the approach to or contact with the second partial surface is approximately 5 to 30 seconds; and (j) that the machine is a printing press.

BRIEF DESCRIPTION OF THE DRAWINGS

Exemplary embodiments of the present invention are illustrated in the drawings and described in detail in the following.

DETAILED DESCRIPTION

Figure 1:
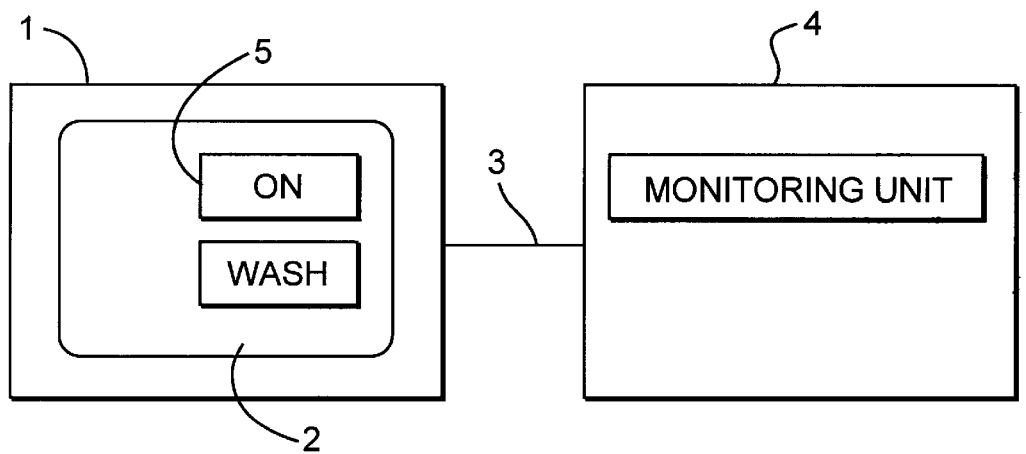
FIG. 1 shows an operator's control in the form of a personal computer or terminal with a touch screen, connected to a printing press controller.

Operator's control 1 illustrated in FIG. 1 is on the console of a printing press and includes a personal computer or a terminal with a touch screen 2, which is connected to a printing press controller 4 via an electrical or optical connection 3 (e.g., cable, HF conductor or optical fiber with suitable interfaces for data transmission). When a partial area 5 labeled "ON" is touched on touch screen 2 by the machine operator, operator's control 1 transmits a start signal to printing press controller 4, which can be a real-time controller of any design. Further partial areas may be provided on touch-screen 2 to trigger further safety-relevant functions such as washing, reversing, etc. For example, one partial area may be labeled "Wash" to start washing operation if certain conditions are met. This is described in the following for the example of starting the printing press.

Figure 2:
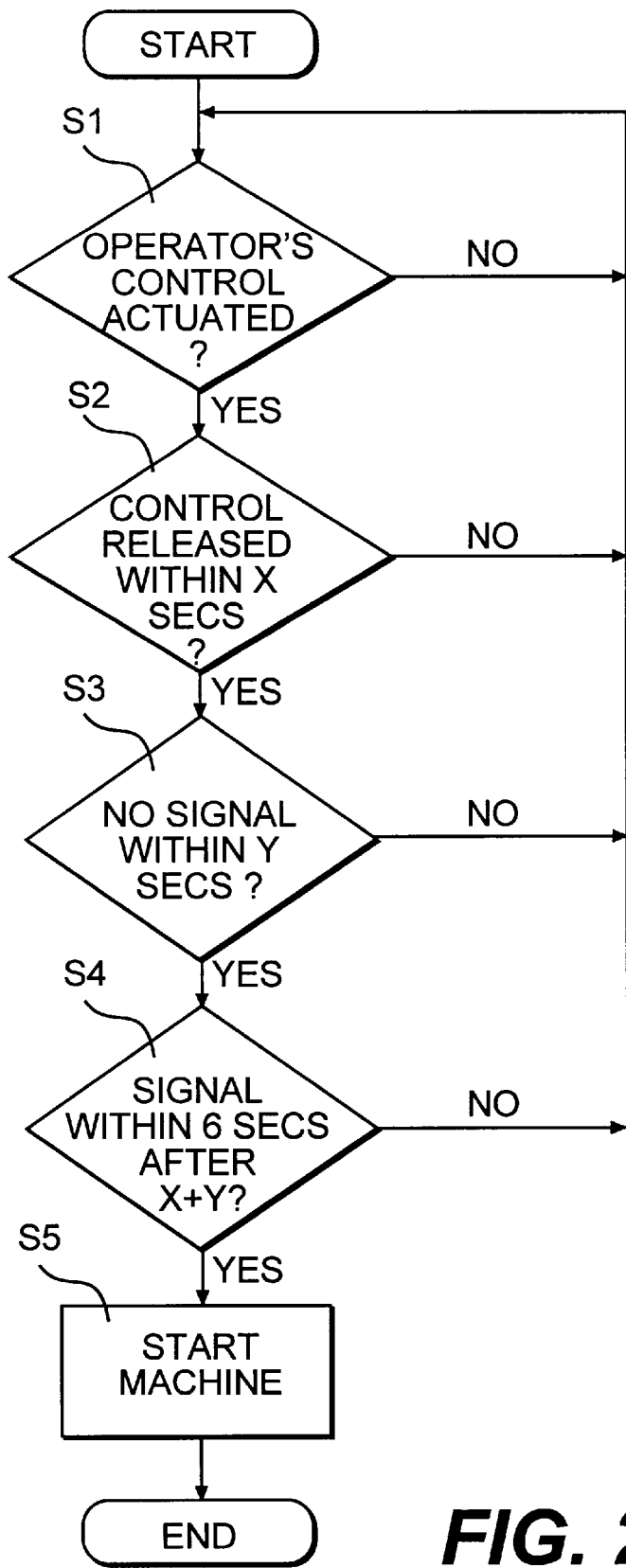
FIG. 2 shows a flow chart illustrating the operation of the monitoring unit in the printing press controller of FIG. 1, FIGS. 3a and 3b show time diagrams to elucidate the monitoring operation.

Printing press controller 4 contains a monitoring unit, which monitors the start sequence, i.e., the time sequence in which the start signal appears. This operation is illustrated in FIG. 2, where x is an "on period," i.e., the time during which the on signal appears for the first time; y is an "off period," during which no start signal should appear, and x+y is a start warning period for the printing press.

Figure 5:
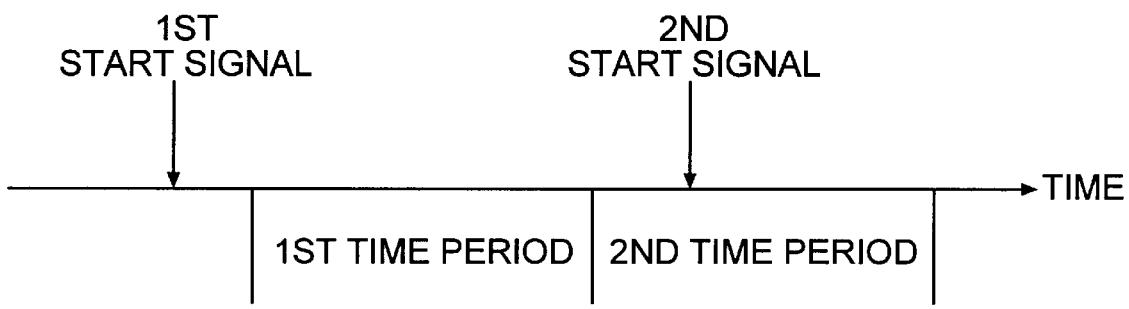
FIG. 5 shows a time diagram illustrating the sequence of start signals.

In process step S1, it is continuously checked whether or not the start signal is present. At the same time, a continuous safety query takes place on the printing press's monitoring devices, which monitor, for example, whether safety hoods are in place, etc. As soon as the start signal appears, the press being provided with the safety device, an acoustic start warning is triggered and monitoring continues with step S2, in which it is checked whether the start signal disappears again within x seconds. If not, the monitoring device returns to step S1 and waits for a new start signal. If the start signal disappears again in step S2 within x seconds after its first appearance, the monitoring device continues with step S3, in which it is checked whether or not a start signal appears in y more seconds. If so, the monitoring device returns to step S1. If no start signal appears within y seconds, it is checked, in step S4, whether the start signal reappears within a time period of six seconds, for example, after the expiration of the start warning period. If not, the monitoring device returns to step S1. If the operating button (i.e., partial area 5) has been actuated for a second time within the period of six seconds, the printing press is started in step S5 with 3000 prints per hour, for example. FIG. 5 illustrates the sequence of the first and second start signals being monitored in the process steps.

Figure 3A:
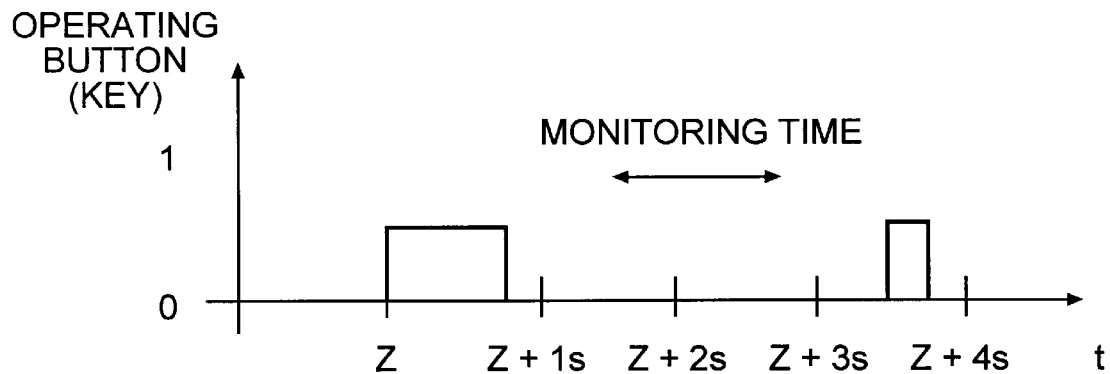
Figure 3B:
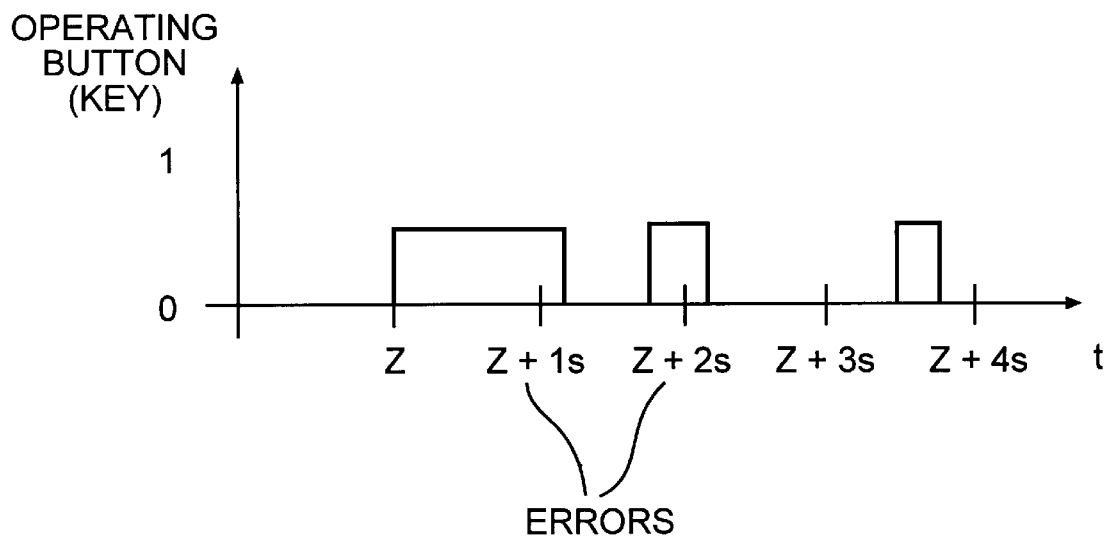

Examples of a correct and an erroneous start sequence are shown in FIGS. 3a and 3b, respectively, assuming an "on period" of one second and an "off period" of two seconds. When the start button, whose state is shown on the ordinate with "0" or "1," is actuated for the first time at a time t=z, the start warning of the press is sounded for three seconds. One second after the button has been activated on touch screen 2, the button should have been released and no signal should appear from the button in the next two seconds. If an erroneous signal was recognized within the monitoring period of two seconds, printing press controller 4 returns to its basic position. FIG. 3b shows examples of two erroneous signal forms, one in the form of an excessively long depression of the button and one in the form of an additional depression of the button during the "off period." After the end of the start warning, the button must be actuated within the next six seconds (the period only partially shown in the figure between z+3 s and z+9 s), and only then does the printing press actually start. Such a case is illustrated in FIG. 3a.

Figure 4A:
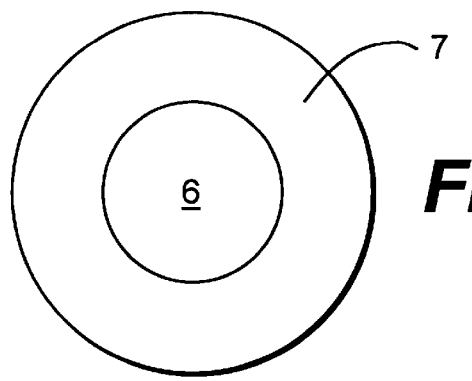
FIGS. 4a and 4b show embodiments for operating surfaces with blocking partial surfaces.

An alternative or additional "fail safe ON" method of controlling the start of a printing press via a touch screen as in FIG. 1 or other flat operator's controls in order to prevent unintended starting of the printing press, is illustrated in FIG. 4a. FIG. 4a shows a section view of a touch screen, in which a start zone 6, which immediately triggers a start warning and subsequent machine operation, is surrounded by an annular blocking zone 7. Touching blocking zone 7 blocks the function of start zone 6 for 10 seconds, for example. Thus, there is a very low probability of erroneous triggering by unintentional touching or wiping of touch screen 2.

Figure 4B:
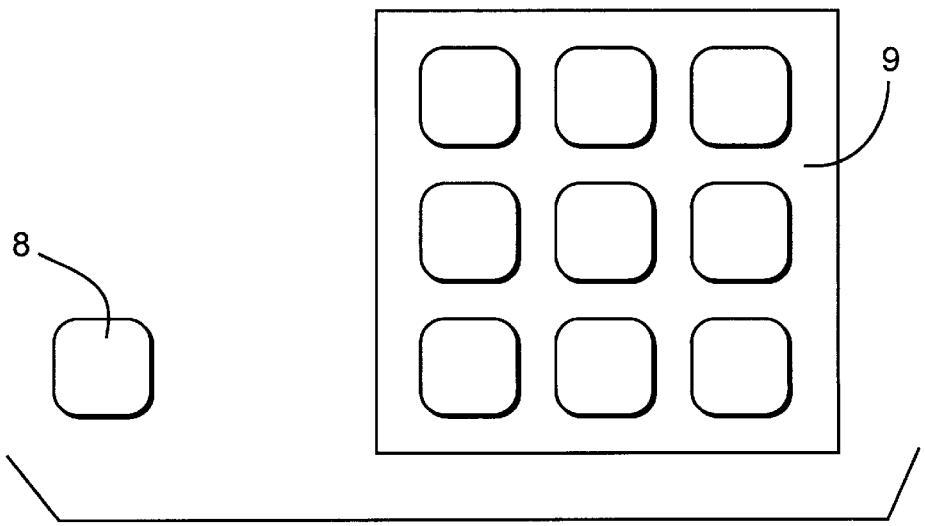

The principle explained with reference to FIG. 4a can also be applied to other types of operating surfaces, which do not represent contiguous surfaces, but are formed by any arrangement of discrete operator's controls. For example, a conventional keyboard such as a membrane keyboard or a keyboard with pressure point keys can be suitably set up. FIG. 4b shows some keys of such a keyboard, where a single key 8 triggers the start of the printing press and the actuation of any key on a keypad 9 blocks the function of key 8 for 20 seconds, for example. Thus erroneous triggering due to "playing around" becomes much less likely. Instead of only one keypad 9 as in FIG. 4b, several keypads, some keys, or key pads around key 8 or all the other keys of the keyboard may have a blocking action. Another example where the principle of FIG. 4b can be applied is a group of distributed proximity sensors, one of which triggers start and some or all of the others have a blocking action.

By combining the present method explained with reference to FIGS. 4a and 4b with those explained with reference to FIGS. 1 through 3, accidental erroneous triggering can be ruled out even more reliably.

What is claimed is:

1. A method for starting a machine using a sensor or sensor field emitting a start signal upon an approach of a body part of a machine operator comprising:

automatically starting the machine if a second start signal appears consecutively after a first start signal and if a machine controller verifies that neither the first nor the second start signal is present within a first predefined time period and that the second start signal is present within a second predefined time period following the first predefined time period, the first predefined time period following a first appearance of the first start signal at a predefined time interval after the first appearance of the first start signal.

2. The method as recited in claim 1 wherein the sensor or sensor field is touch-sensitive, and the approach of the body part to the sensor or sensor field involves contact with the sensor or sensor field.

3. The method as recited in claim 1 wherein the predefined time interval is 1 second and the first predefined time period is 2 seconds.

4. The method as recited in claim 1 wherein the second predefined time period immediately follows the first predefined period and is between 3 and 6 seconds long.

5. The method as recited in claim 1 wherein the sensor field includes a touch-sensitive screen displaying an image or a partial image.

6. The method as recited in claim 5 wherein the touch-sensitive screen is a component of a data terminal or a personal computer connected to the machine controller via a data cable.

7. The method as recited in claim 1 wherein the machine is a printing press.

8. A device for starting a machine comprising:

a proximity- or touch-sensitive operating surface having a first partial surface and at least one second partial surface, the first partial surface having a function of starting the machine, the at least one second partial surface blocking the function for a predefined time period in response to proximity to or contact of the at least one second partial surface.

9. The device as recited in claim 8 wherein the at least one second partial surface has a substantially larger surface area than the first partial surface.

10. The device as recited in claim 8 wherein the at least one second partial surface is arranged near the first partial surface.

11. The device as recited in claim 10 wherein the at least one second partial surface is located about the first partial surface.

12. The device as recited in claim 11 wherein the at least one second partial surface forms a contiguous surface circumscribing the first partial surface.

13. The device as recited in claim 8 wherein the operating surface is essentially planar.

14. The device as recited in claim 13 wherein the operating surface is a touch-sensitive screen displaying partial images forming the first partial surface and the at least one second partial surface.

15. The device as recited in claim 13 wherein the operating surface is a touch-sensitive sensor field.

16. The device as recited in claim 13 wherein the operating surface is a keyboard with one key forming the first partial surface and with a plurality of additional keys forming the at least one second partial surface.

17. The device as recited in claim 8 wherein the predefined time period is approximately 5 to 30 seconds.

18. The device as recited in claim 8 wherein the machine is a printing press.

* * * * *